United States Patent
Li et al.

(10) Patent No.: US 7,467,367 B1
(45) Date of Patent: Dec. 16, 2008

(54) METHOD AND SYSTEM FOR CLOCK TREE SYNTHESIS OF AN INTEGRATED CIRCUIT

(75) Inventors: Hung-Chun Li, San Jose, CA (US); Chien-Chu Kuo, San Jose, CA (US); Minghorng Lai, Cupertino, CA (US); Ming-Chyuan Chen, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 420 days.

(21) Appl. No.: 11/259,044

(22) Filed: Oct. 27, 2005

(51) Int. Cl.
*G06F 17/50* (2006.01)
(52) U.S. Cl. .................. 716/7; 716/1; 716/8; 716/9; 716/10
(58) Field of Classification Search ............. 716/1, 716/7–11
See application file for complete search history.

(56) References Cited

U.S. PATENT DOCUMENTS

| | | | | |
|---|---|---|---|---|
| 4,797,842 A * | 1/1989 | Nackman et al. | ............. | 716/20 |
| 5,430,397 A * | 7/1995 | Itoh et al. | ............. | 326/101 |
| 5,656,963 A * | 8/1997 | Masleid et al. | ............. | 327/297 |
| 5,691,662 A * | 11/1997 | Soboleski et al. | ............. | 327/292 |
| 6,080,206 A * | 6/2000 | Tadokoro et al. | ............. | 716/10 |
| 6,205,571 B1 * | 3/2001 | Camporese et al. | ............. | 716/2 |
| 6,223,329 B1 * | 4/2001 | Ling et al. | ............. | 716/7 |
| 6,286,128 B1 * | 9/2001 | Pileggi et al. | ............. | 716/18 |
| 6,467,074 B1 * | 10/2002 | Katsioulas et al. | ............. | 716/17 |
| 6,480,989 B2 * | 11/2002 | Chan et al. | ............. | 716/8 |
| 6,480,991 B1 * | 11/2002 | Cho et al. | ............. | 716/8 |
| 6,546,537 B1 * | 4/2003 | Komoda | ............. | 716/12 |
| 6,546,540 B1 * | 4/2003 | Igarashi et al. | ............. | 716/13 |
| 6,609,241 B2 * | 8/2003 | Yonemori | ............. | 716/12 |
| 6,651,232 B1 * | 11/2003 | Pileggi et al. | ............. | 716/7 |
| 6,661,736 B2 * | 12/2003 | Magoshi | ............. | 365/233.14 |
| 6,665,849 B2 * | 12/2003 | Meuris et al. | ............. | 716/7 |
| 6,845,492 B1 * | 1/2005 | Frank et al. | ............. | 716/2 |
| 7,272,808 B1 * | 9/2007 | Sharma et al. | ............. | 716/6 |
| 7,280,945 B1 * | 10/2007 | Weiner et al. | ............. | 703/2 |
| 7,308,666 B1 * | 12/2007 | Li | ............. | 716/7 |
| 7,392,495 B1 * | 6/2008 | Cherukupalli et al. | ............. | 716/10 |
| 2004/0225981 A1 * | 11/2004 | Cocchini | ............. | 716/9 |
| 2007/0038430 A1 * | 2/2007 | Walker et al. | ............. | 703/14 |
| 2007/0157133 A1 * | 7/2007 | Cheng et al. | ............. | 716/4 |
| 2008/0141206 A1 * | 6/2008 | He | ............. | 716/12 |

\* cited by examiner

*Primary Examiner*—Jack Chiang
*Assistant Examiner*—Naum B Levin
(74) *Attorney, Agent, or Firm*—Rosenberg, Klein & Lee (57) ABSTRACT

Aspects for clock tree synthesis of an integrated circuit include performing top-level clock tree synthesis, and estimating one or more block-level clock tree structures of the integrated circuit. The block-level clock tree structure is estimated based on a grid-based clock tree estimation, wherein each block is subdivided into one or more grids. The aspects further include merging of the estimated block-level clock tree structures with the top-level clock tree synthesis.

19 Claims, 7 Drawing Sheets

METHOD AND SYSTEM FOR CLOCK TREE SYNTHESIS OF AN INTEGRATED CIRCUIT

BACKGROUND

The present invention relates to a method and system for clock tree synthesis of integrated circuits.

With the advent of deep sub-micron technologies, the design closure for very large integrated circuits has become complicated. As a result, System-on-chip (SoC) designs are implemented with a hierarchical design flow. The hierarchical design flow allows multiple teams to work on different parts of the design concurrently and independently. Further, the hierarchical design flows are scalable to handle designs for integrated circuits containing up to 100 million gates.

One fundamental problem with a hierarchical design flow is the large number of iterations required for meeting skew specifications. A skew is referred to as the time difference between the arrival times of each clock signal pulse at any two sinks. As a result, an efficient method for clock tree synthesis of hierarchical design flows is required. Clock tree synthesis designs a group of clock trees to be incorporated into an integrated circuit design for conveying separate clock signals to clock sinks, within the integrated circuit, with a pre-determined maximum group skew. The clock trees are referred to as the branching network of a conductor and a buffer, to fan out a clock signal arriving at one of its input terminals, to each of the sinks that are clocked by that clock signal.

Several methods have been conventionally used for clock tree synthesis of hierarchical design flows. The major concerns of such methods are minimizing clock skew and optimizing clock buffers. This results in meeting skew specifications and minimizing clock tree power dissipation. Variations in the clock signal's arrival time at the clock inputs of various logic elements cause a clock skew. While designing a clock tree, the performance specifications that are timing-related and affect other chip design goals are crucial and need to be considered. Clock tree timing specifications include clock latency, skew, and jitter. Non-timing specifications include power dissipation, signal integrity, and reliability due to electro migration effects in the clock lines.

Several methods have been conventionally used by chip designers for clock tree synthesis of hierarchical design flows. One such method is the bottom-up methodology. This method firstly designs the block-level of the clock tree, i.e., the designing is done individually for each block. Subsequently, the full chip is designed based on the block-level results. A block-level clock tree tends to be over-designed, and the runtime can become very long. Further, the bottom-up method provides lesser uniform path distance between the buffers at the top-level of the clock tree. As a result, balancing the clock tree becomes difficult. Balancing the clock tree refers to the positioning of each fan-out buffer, so as to minimize the variation in the signal path distances from each fan-out buffer, to the next lower level fan-out buffer or sink it drives.

This problem of lesser uniform path distance at the top-level of the clock tree is addressed by another conventionally used method, referred to as top-down methodology. This method firstly designs the top-level of the clock tree and then the block-levels are designed based on the top-level design. Subsequently, the full chip is balanced based on the top-level result. The top-down methodology provides a relatively uniform path distance between the buffers at the top-level of the clock tree. However, at the block-levels of the clock tree the path distance becomes less uniform. As a result, it becomes more difficult to balance the clock tree, and the convergence is achieved slowly. Further, the top-down methodology is unable to obtain an accurate clock budgeting for both top-level and block-level. This leads to several iterations to refine the result, and the quality and runtime of the integrated circuits is degraded. Furthermore, the complexity of the hierarchical design flow increases tremendously.

In light of the foregoing discussion, a need exists for reducing the number of iterations required for clock tuning, between a top-level clock tree and a block-level clock tree, in a hierarchical design clock tree synthesis. The present invention addresses such a need.

SUMMARY

Aspects for clock tree synthesis of an integrated circuit include performing top-level clock tree synthesis, and estimating one or more block-level clock tree structures of the integrated circuit. The block-level clock tree structure is estimated based on a grid-based clock tree estimation, wherein each block is subdivided into one or more grids. The aspects further include merging of the estimated block-level clock tree structures with the top-level clock tree synthesis.

Through the present invention, there is a reduction in the number of iterations required for clock tuning between top-level clock tree and block-level clock tree in a hierarchical design clock tree synthesis. Consequently, a correct full-chip clock budgeting and convergence is achieved faster. Further, the present invention facilitates reduction of the complexity of the hierarchical design flow. These and other advantages will be more fully appreciated in conjunction with the following detailed description and accompanying drawings.

BRIEF DESCRIPTION OF THE DRAWINGS

Various embodiments of the present invention will hereinafter be described in conjunction with the appended drawings provided to illustrate, and not to limit the present invention, wherein like designations denote like elements, and in which.

DESCRIPTION OF VARIOUS EMBODIMENTS

Various embodiments of the present invention relate to the method and systems for clock tree synthesis of an integrated circuit. Such an integrated circuit has a hierarchical structure. The clock tree synthesis of the hierarchical integrated circuit is achieved by performing a top-level clock tree synthesis and estimating one or more block-level clock tree structures of the integrated circuit. The block-level clock tree structure is estimated based on grid-based clock tree estimation, wherein each block is subdivided into one or more grids. Subsequently, the estimated block-level clock tree structures are merged with the top-level clock tree synthesis. This results in the reduction of the number of iterations required for clock tuning between top-level clock tree and block-level clock tree in a hierarchical design clock tree synthesis. Consequently, a correct full-chip clock budgeting and convergence is achieved faster. Further, such a method and system reduces the complexity of the hierarchical design flow.

Figure 1:
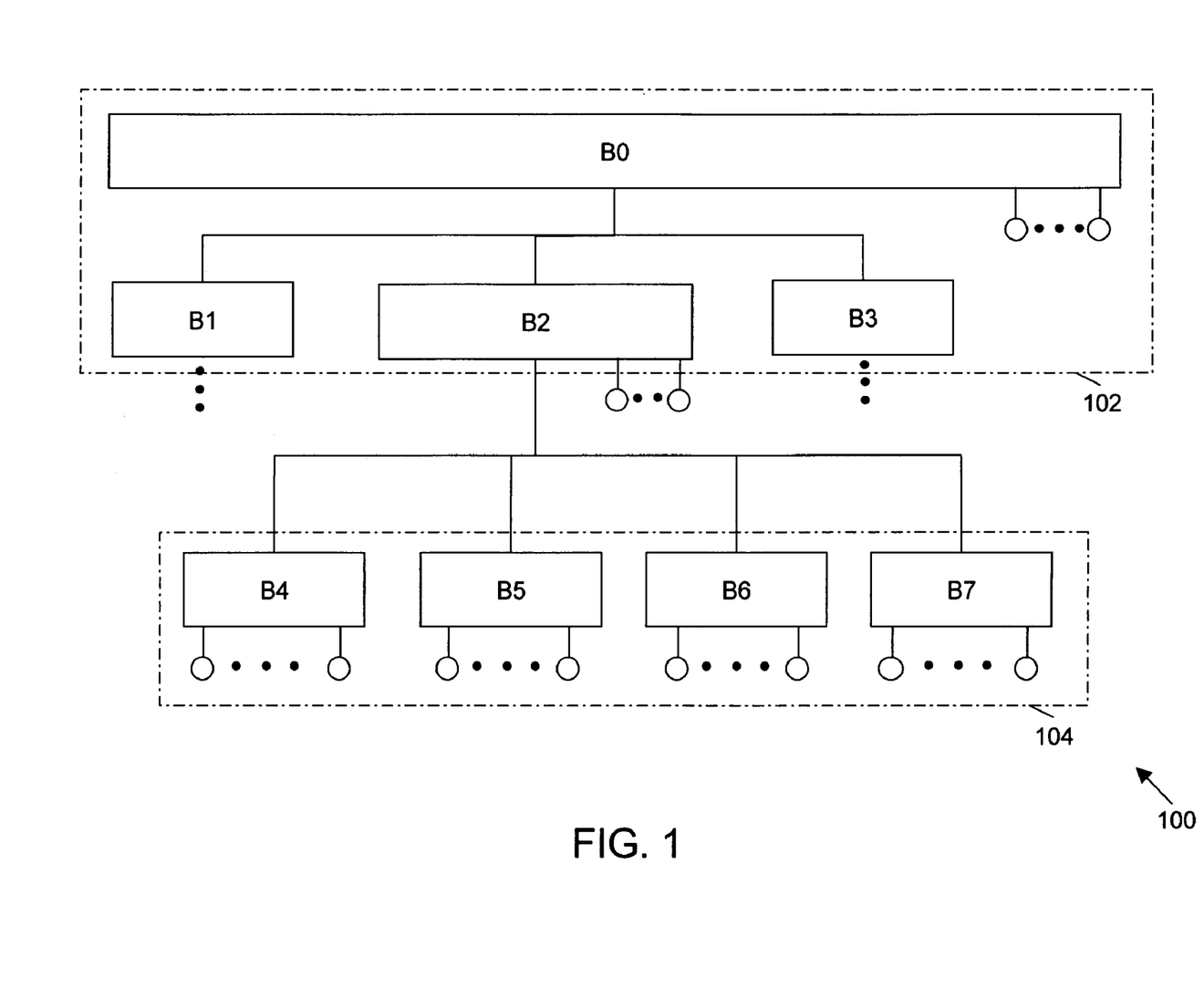
FIG. 1 illustrates an example block diagram illustrating a hierarchical integrated circuit design, in accordance with the present invention.

FIG. 1 illustrates an example block diagram of an integrated circuit, by way of example integrated circuit 100, in accordance with the present invention. Integrated circuit 100 has a hierarchical design. Integrated circuit 100 includes blocks, for example blocks B0, B1, B2, B3, B4, B5, B5, B6, and B7. Block B0 is formed by blocks B1, B2, B3. B0 thus constitutes the first level of integrated circuit 100. Blocks B1, B2, and B3 form the second level of integrated circuit 100. The higher levels of an integrated circuit are referred to as a top-level of the integrated circuit. Therefore, blocks B0, B1, B2, and B3 are referred to as a top-level 102 of integrated circuit 100. Blocks B1 and B3 may further include various cells.

Block B2 is formed by blocks B4, B5, B6, and B7. As a result, blocks B4, B5, B6, and B7 form the third level of integrated circuit 100. The lower levels of an integrated circuit are referred to as the block-level of the integrated circuit. Therefore, blocks B4, B5, B6, and B7 are referred to as a block-level 104 of integrated circuit 100. Blocks B4, B5, B6, and B7 further include various cells.

It is to be noted that the three hierarchical levels shown in FIG. 1 are an example, and for the purpose of illustration. There can be a different number of hierarchical levels in an integrated circuit without diverting from the scope of the present invention.

In accordance with an embodiment of the present invention, integrated circuit 100 implements synchronous logic circuits that are clocked by externally generated clock signals. A typical integrated circuit 100 can have, for example hundreds or thousands of clocked devices. These clocked devices, for example, include latches, registers, and flip-flops. Through clock tree synthesis, a clock tree is designed for routing clock edges from integrated circuit 100's clock input terminal concurrently to all sinks, by way of example, the cells corresponding to block B4. The clock devices along with the routes for routing the clock edges constitute a basic framework for the clock tree. Once the basic framework of the clock tree is prepared, the clock tree is balanced so as to ensure that each clock signal edge arrives at all the sinks at nearly the same time. As a result, the clock signal skew between the sinks can become zero. Further, if required, repeaters are added to various branches of the clock tree to reduce the signal path delay associated with the branch and/or balance the clock tree. This process of balancing the clock tree is performed iteratively.

In accordance with various embodiments of the present invention, the hierarchical design of integrated circuit 100 contributes to a clock tree synthesis of integrated circuit 100. The clock tree synthesis is substantially impacted by clock budgeting of integrated circuit 100. In various embodiments of the invention, the constraints defining clock specification are pre-defined by a circuit designer. Clock tree synthesis is performed iteratively to enable the designing of an integrated circuit that satisfies the constraints defined by clock specification.

Figure 2:
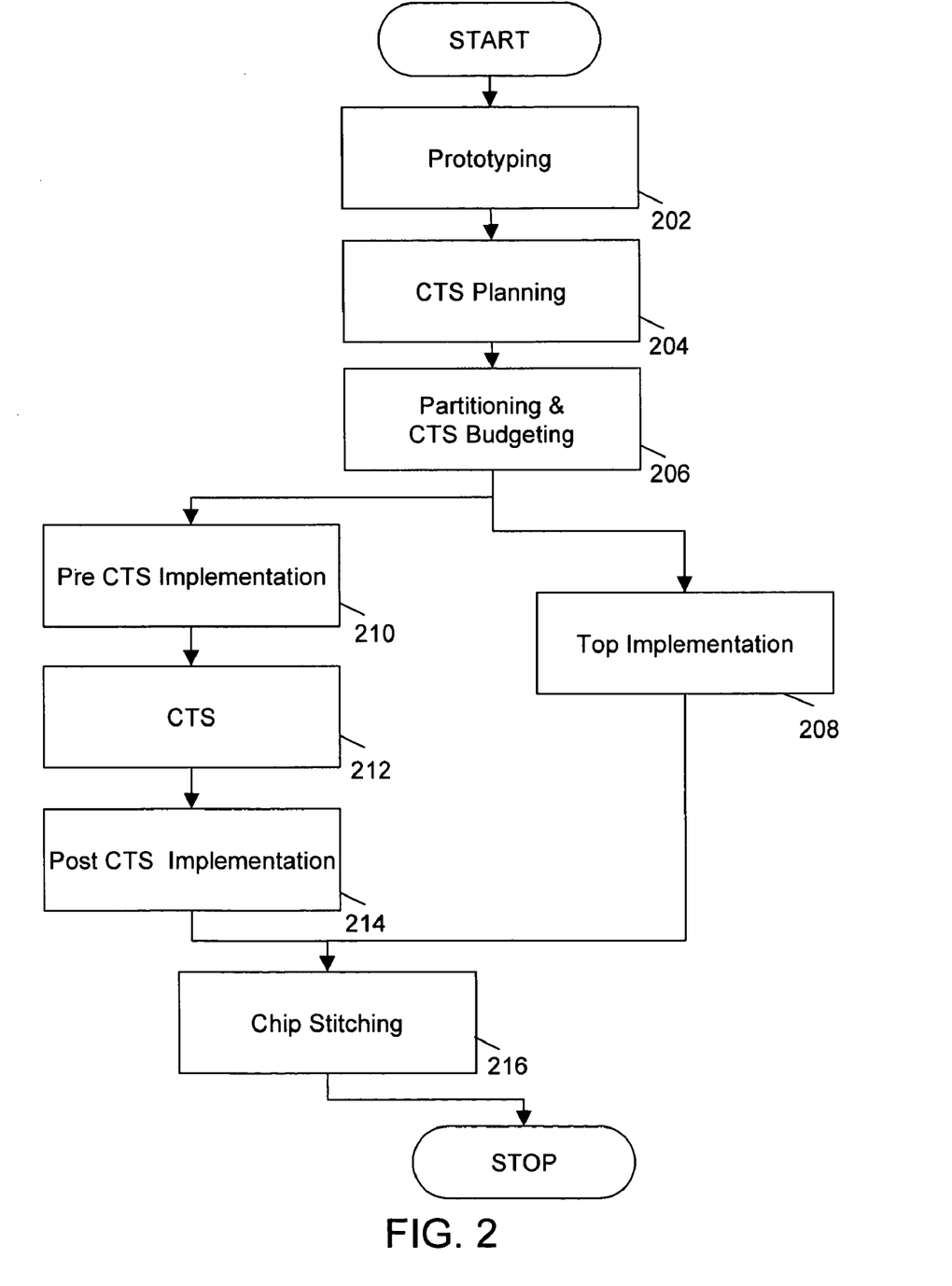
FIG. 2 illustrates a flowchart for an example design flow of the proposed hierarchical clock tree synthesis (CTS) flow of an integrated circuit, in accordance with various embodiments of the present invention.

FIG. 2 illustrates a flowchart for an example design flow of the proposed hierarchical clock tree synthesis flow of an integrated circuit, by way of example integrated circuit 100, in accordance with various embodiments of the present invention. In various embodiments of the present invention, the proposed hierarchical clock tree synthesis flow of integrated circuit 100 forms an integral part of electronic design automation (EDA). EDA is the category of tools for designing and producing electronic systems ranging from printed circuit boards to integrated circuits.

At act 202, prototyping of a design, by way of example, integrated circuit 100 is carried out. Prototyping includes floor planning and low effort optimization of integrated circuit 100. Floor planning refers to the placement of major components, by way of example, B0, B1, B2, B3, B4, B5, B5, B6, and B7, within the area of integrated circuit 100 based on a set of design rules. At act 204, clock tree synthesis (CTS) planning is carried out. The act of CTS planning is described herein below in conjunction with FIGS. 3A and 3B.

At act 206, partitioning and clock budgeting of integrated circuit 100 is carried out. Partitioning of integrated circuit 100 involves producing a partoned layout of integrated circuit 100, in which one or more selected blocks are to be placed in separate partitions of a substrate. For example, partitioning of integrated circuit 100 includes specifying positions where blocks B0, B1, B2, B3, B4, B5, B5, B6, and B7 are to be placed in particular rectangular partitions of an integrated circuit substrate.

Subsequently, at act 208, clock tree synthesis of top-level 102 is performed. This includes the identification of clock entry points in integrated circuit 100. Further, top-level clock tree synthesis is performed up to the identified clock entry points.

At act 210, pre-CTS implementations are performed. The pre-CTS implementations include the formation of grids. Each of the blocks B0, B1, B2, B3, B4, B5, B5, B6, and B7 are divided into uniform grids. Subsequently, at least one of the clock tree latency and skew are determined for the grids based on one or more pre-determined parameters. These pre-determined parameters include, for example, real leaf cells, grid area, technology-specific information, or a combination thereof.

At act 212, clock tree synthesis is performed. The clock tree synthesis is performed at the block level based on the clock constraint as budgeted from act 206. At act 214, post-CTS optimization is implemented. At step 216, the post-CTS implementation results are stitched with the top-level CTS implementation. As a result, a quick convergence of integrated circuit 100 is achieved.

Figure 3A:
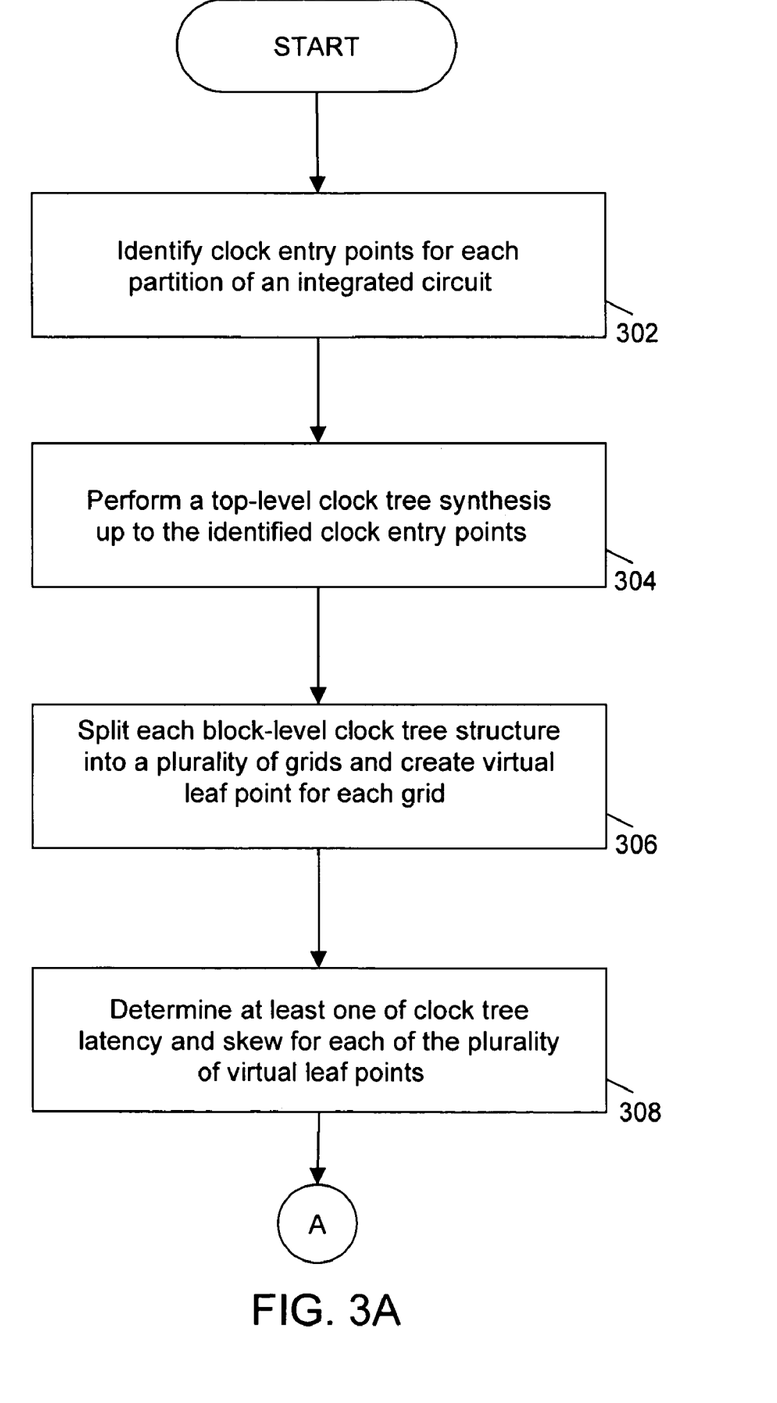
FIGS. 3A and 3B illustrate a flowchart for a method for clock tree planning of an integrated circuit, in accordance with an embodiment of the present invention.
Figure 3B:
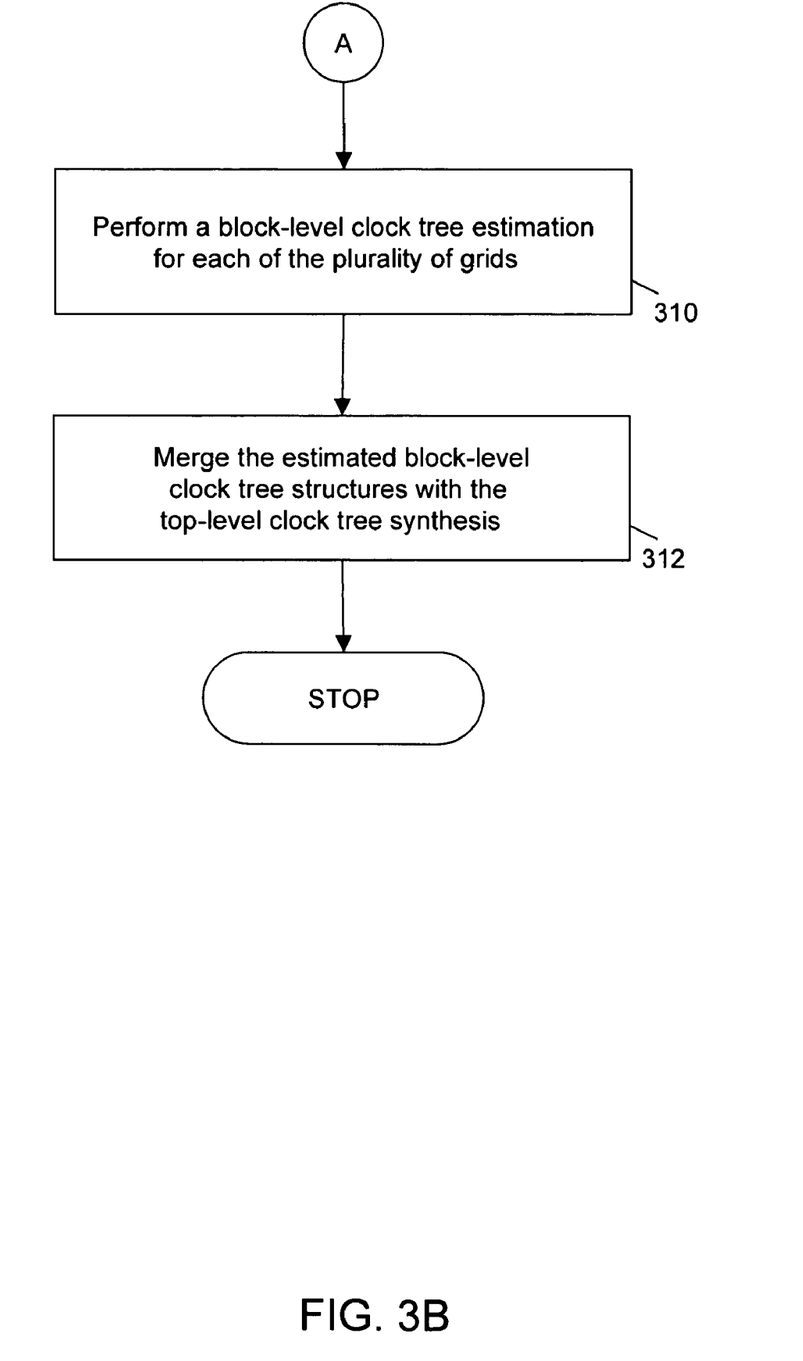

FIGS. 3A and 3B illustrate a flowchart for a method for the clock tree planning of an integrated circuit, by way of example, integrated circuit 100, in accordance with an embodiment of the present invention. At act 302, the clock entry points are identified for each partition of integrated circuit 100. In an embodiment of the present invention, the clock entry points of each partition are chosen as the closest point to the clock source. At act 304, a clock tree synthesis of top-level 102 is performed. Such a synthesis is performed up to the identified clock entry points.

In accordance with various embodiments of the present invention, a quick implementation of the clock tree corresponding to top-level 102 can be carried out by a minimum latency tree synthesis algorithm, as is well understood in the art.

At act 306, each block-level clock tree structure, for example, clock tree structure of block-level 104 is split into a plurality of grids and virtual leaf point for each of the plurality of grids are created. The plurality of grids has uniform shape and size and each of the plurality of grids includes one virtual leaf point. For example, each of the blocks B0, B1, B2, B3, B4, B5, B6, and B7 are divided into uniform grids. These virtual leaf points represent one or more real leaf points within specific grid. In accordance with an embodiment of the present invention, one virtual leaf point can include hundreds and thousands of real leaf points. As a result, the grid can be easily represented without making the grid design complex.

At act 308, at least one of clock tree latency and skew are determined for each of the plurality of virtual leaf points. Such a determination is based on, by way of example, real leaf cells, grid area, average unit of resistance and capacitance, average driving strength of clock buffer, or a combination thereof. The grid-level clock latency and skew is then used to compute the block-level clock latency and skew, respectively. The clock tree latency can be computed by the summation of a clock driver delay and a net delay. Such a computation is carried from the clock source to the clock leaf pin. The computation of clock tree latency is critical because clock budgeting is performed based on the determined clock tree latency. The main objective is to minimize the skew and to keep it as short as possible.

In accordance with an embodiment of the present invention, the determination of clock tree latency and skew can be based on technology-specific information. For example, the technology-specific information may vary from a 90 nm design of integrated circuit to a 130 nm design.

At act 310, the clock tree estimation is performed for each of the plurality of grids. This is based on the computed clock latency and skew at grid-level. The block-level clock tree synthesis is implemented upon the plurality of grids. Subsequently, at act 312, the estimated block-level clock tree structures are merged with the top-level clock tree synthesis. This involves combining the block-level clock tree estimate with the synthesized top-level clock tree.

In various embodiments of the present invention, the above-mentioned steps 302-312 are repeated until the clock specification constraints are satisfied. The embodiments of the present invention ensure a rapid convergence to the clock specification constraints.

In various embodiments of the invention, the grid area can be defined depending on the complexity of the integrated circuit design required. Further, the grid area can be modified during each iteration to ensure a faster convergence. For example, in the initial iteration stage, the grids can be coarse to obtain a rough/quick clock tree estimate. In subsequent iterations, the grids can be made finer to enable a more accurate clock tree estimate.

Figure 4:
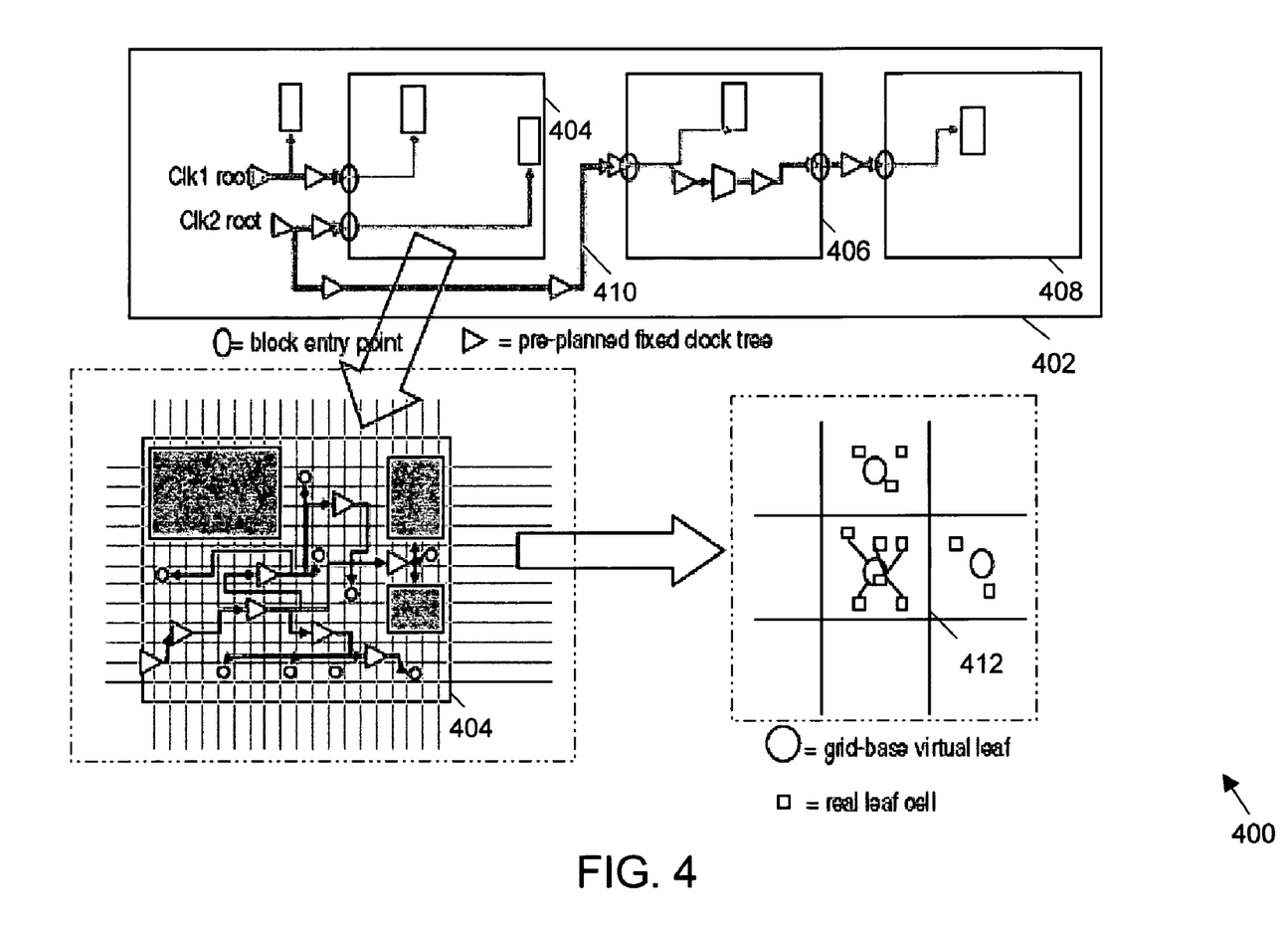
FIG. 4 illustrates an example block diagram of a grid-based clock tree synthesis estimation, in accordance with an embodiment of the present invention.

FIG. 4 illustrates an example block diagram of a grid-based clock tree synthesis estimation, in accordance with an embodiment of the present invention. The block diagram includes an integrated circuit 402. Integrated circuit 402 includes blocks 404, 406, and 408; a top-level clock tree structure 410; and grids, for example a grid 412. Blocks 404, 406, and 408 are triggered with a common external clock and can be referred to as sinks of integrated circuit 402. As depicted in the exemplary block diagram, the ovals represent the clock entry points of each of blocks 404, 406, and 408.

Top-level clock tree structure 410 represents the partitioning and placement of integrated circuit 402 such that the clock tree is balanced. Balancing the clock tree refers to the positioning of each fan-out repeater so as to minimize the variation in the signal path distances from each fan-out repeater to the next lower level fan-out repeaters or sinks it drives.

After performing top-level clock tree synthesis 410 up to the identified clock entry points, one or more block-level clock tree structures are estimated. The estimated block-level clock tree structures of integrated circuit 402 are divided into uniform grids and virtual leaf points. In an embodiment of the present invention, splitting or dividing each block-level clock tree structure can be referred to as a grid-based algorithm.

Corresponding to block-level clock tree structure 410, grid 412 is formed. Grid 412 includes various partitions. The partitions include a grid-base virtual leaf. The virtual leaf cell includes a real leaf cell. In an embodiment of the present invention, the number of real leaf cells that a virtual leaf cell includes depends on the design specification of the chip designer. For example, the number of real leaf cells included in the virtual leaf cell may vary from one technology to another.

Subsequently, at least one or more clock tree latency and skew are determined for each of the plurality of virtual leaf points. Once clock tree latency and skew are determined for the grids associated with block-level clock tree structure 410, the estimated block-level clock tree structure is merged with top-level clock tree synthesis 410. Consequently, the full chip design of integrated circuit 402 is achieved.

In an embodiment of the present invention, the shape and size of the grid can be adjusted depending on the requirement of the chip designer. This is because the grids can be scalable. If the chip designer prefers better runtime then the grids can be made coarse. However, if the chip designer prefers better accuracy, then the grids can be made fine.

Figure 5:
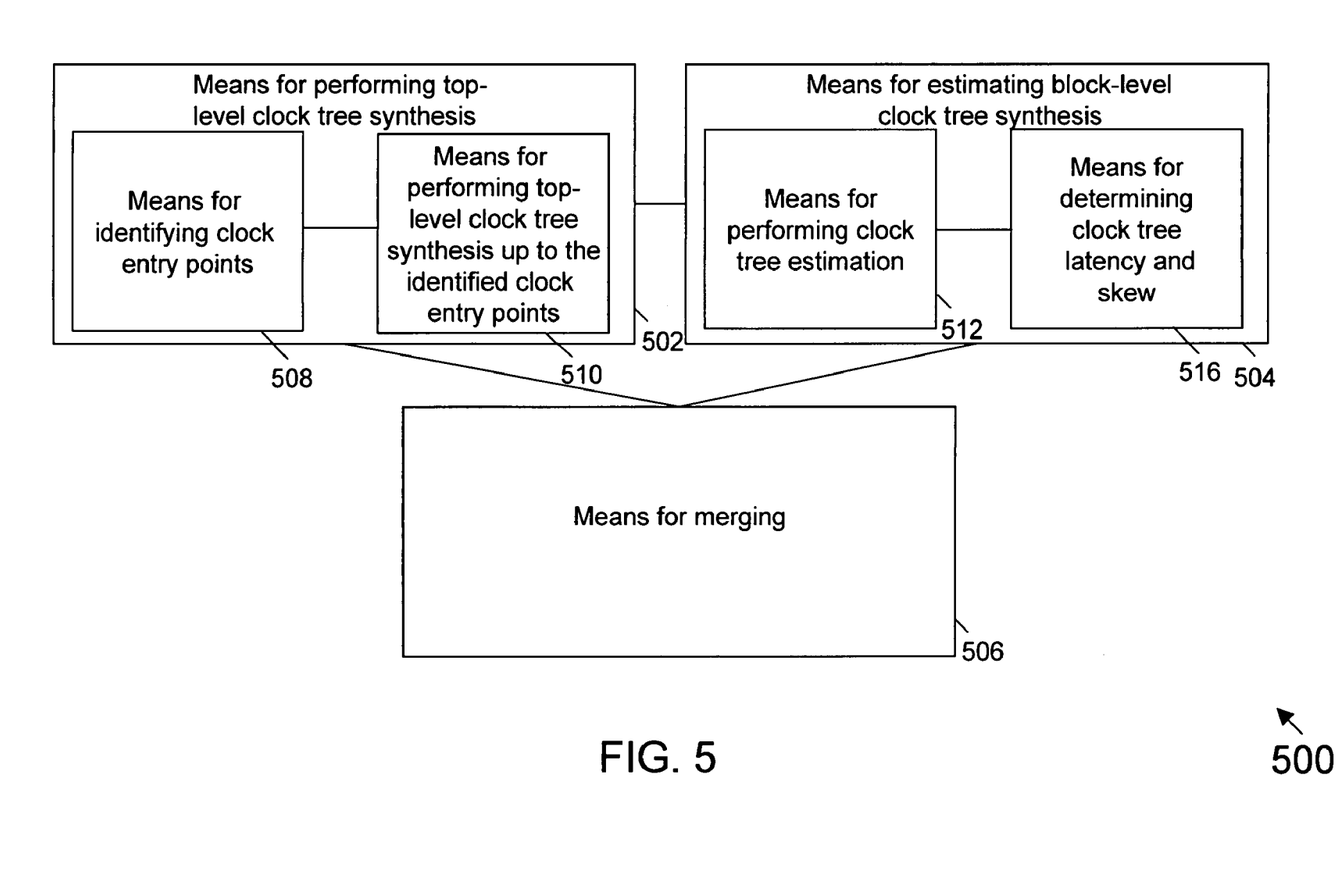
FIG. 5 illustrates a block diagram of various functional modules for clock tree synthesis of an integrated circuit, in accordance with an embodiment of the present invention.

FIG. 5 illustrates a block diagram of various functional modules of a system 500 for clock tree synthesis of an integrated circuit, by way of example, integrated circuit 100, in accordance with an embodiment of the present invention. The block diagram includes a means for performing top-level clock tree synthesis 502, a means for estimating block-level clock tree synthesis 504, and a means for merging 506. Means for performing top-level clock tree synthesis 502 includes a means for identifying clock entry points 508 and a means for performing a top-level clock tree synthesis up to the identified clock entry points 510. Means for estimating the block-level clock tree synthesis 504 includes a means for performing clock tree estimation 512 and a means for determining clock tree latency and skew 516.

Means for identifying clock entry points 508 identifies the clock entry points in integrated circuit 100. In an embodiment of the present invention, the clock entry points are automatically chosen by tools. Mostly, the closest point to the clock source will be chosen. Means for performing top-level clock tree synthesis up to the identified entry points 510 performs clock tree synthesis of top-level 102 up to the identified clock entry points.

In various embodiments of the invention, means for performing top-level clock tree synthesis up to the identified clock entry points 510 can be implemented by a technique described in conjunction with step 304 illustrated in FIG. 3.

Means for performing clock tree estimation 512 performs an estimation of the clock tree at the block-level based on clock tree latency and skew computed for each grid. Means for determining clock tree latency and skew 516 determines at least one of the clock tree latency and skew for each of the plurality of grids. Each of the plurality of grid includes a plurality of virtual leaf points.

In accordance with an embodiment of the present invention, clock tree latency and skew is computed using the technique described in conjunction with act 308 in FIG. 3. Means for merging 506 merges the estimated block-level clock tree latency with the top-level clock tree synthesis.

In various embodiments of the invention, system 500 can be implemented in the form of software modules. In an embodiment of the invention, system 500 is implemented as part of Electronic Design Automation (EDA) software.

Figure 6:
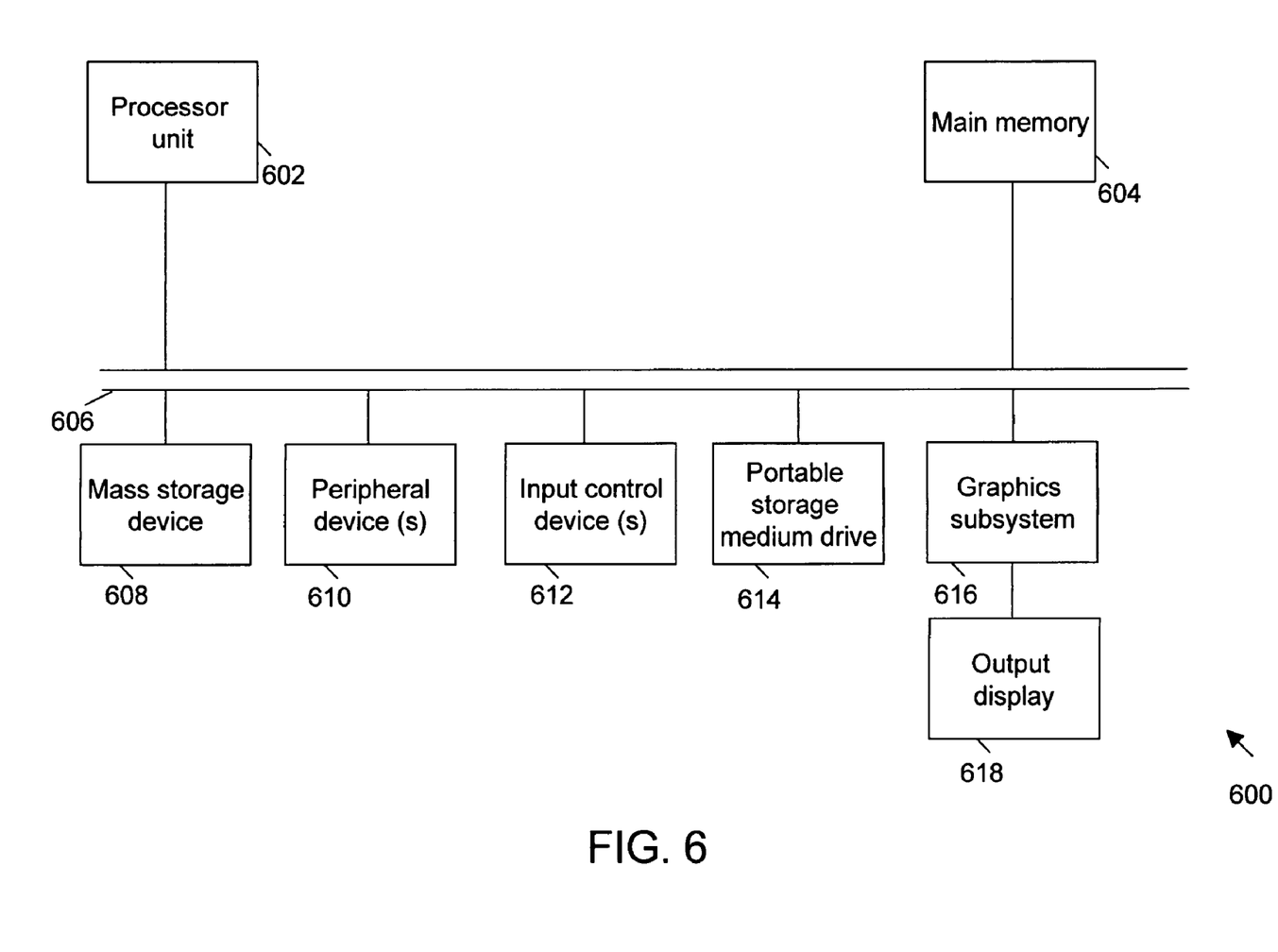
FIG. 6 illustrates a block diagram of a general-purpose computer system for executing an electronic design automation (EDA) software, in accordance with various embodiments of the present invention.

FIG. 6 illustrates a block diagram of a general-purpose computer system for executing EDA software, in accordance with various embodiments of the present invention. A computer system 600 contains a processor unit 602, a main memory 604, an interconnect bus 606, a mass storage device 608, a peripheral device(s) 610, an input control device(s) 612, a portable storage medium drive(s) 614, a graphics subsystem 616, and an output display 618. Processor unit 602 can include a single microprocessor or a plurality of microprocessors for configuring computer system 600 as a multi-processor system. Main memory 604 stores, in part, instructions and data to be executed by processor unit 602. Main memory 604 can include banks of dynamic random access memory (DRAM) as well as high-speed cache memory.

For the purpose of simplicity, all the components of computer system 600 are connected via interconnect bus 606. However, computer system 600 may be connected through one or more data transport means. For example, processor unit 602 and main memory 604 may be connected via a local microprocessor bus; and mass storage device 608, peripheral device(s) 610, portable storage medium drive(s) 614, and graphics subsystem 616 may be connected via one or more input/output (I/O) buses. Mass storage device 608, which can be implemented with a magnetic disk drive or an optical disk drive, is a non-volatile storage device for storing data and instructions, to be used by processor unit 602. In the software embodiment, mass storage device 608 stores the software, to load it to main memory 604.

Portable storage medium drive 614 operates in conjunction with a portable non-volatile storage medium, such as a floppy disk or a compact disc read only memory (CD-ROM), to input and output data and code to and from computer system 600. In one embodiment, the software is stored on such a portable medium, and is input to computer system 600 via portable storage medium drive 614. Peripheral device(s) 610 can include any type of computer support device such as an input/output (I/O) interface, to add additional functionality to computer system 600. For example, peripheral device(s) 610 can include a network interface card, to interface computer system 600 to a network.

Input control device(s) 612 provide a portion of the user interface for a computer system 600 user. Input control device(s) 612 may include an alphanumeric keypad for inputting alphanumeric and other key information; a cursor control device such as a mouse, a trackball or stylus; or cursor direction keys. In order to display textual and graphical information, computer system 600 contains graphics subsystem 614 and output display 618. Output display 618 may include a cathode ray tube (CRT) display or liquid crystal display (LCD). Graphics subsystem 616 receives textual and graphical information, and processes the information for output-to-output display 618. The components of computer system 600 are those that are typically found in general-purpose computer systems, and, in fact, these components are intended to represent a broad category of such computer components that are well known in the art.

For software implementation, the EDA software includes a plurality of computer executable instructions, to be implemented on a general-purpose computer system. Prior to loading it into a general-purpose computer system, the EDA software may reside as encoded information on a computer-readable medium such as a magnetic floppy disk, a magnetic tape or a compact disc read only memory (CD-ROM). In one hardware implementation, the EDA software may comprise a dedicated processor comprising processor instructions for performing the functions described herein. Circuits may also be developed to perform these functions.

Various embodiments of the present invention provide a clock tree synthesis of an integrated circuit. The clock tree synthesis of the integrated circuit is achieved for the full chip. This includes dividing each of the blocks of the integrated circuit into grids and then estimating the block-level clock tree synthesis.

Various embodiments of the present invention provide a design process that can be used in large-scale design without degrading the quality and runtime. This is achieved by dividing each of the blocks into grids. The grids are scalable in nature. Further, the grid size could vary based on the block size so as to fit any size of the block. For example, a coarse grid provides better runtime. On the contrary, a fine grid provides better accuracy.

Various embodiments of the present invention reduce the iterations of the hierarchical design flow. This leads to a real top-level single pass flow of the integrated circuit. This is achieved by an accurate clock tree planning of the integrated circuit.

Various embodiments of the present invention reduce the complexity of the integrated circuit. This is achieved by taking the pre-CTS budgeting constraint down to the post-CTS stage.

Various embodiments of the present invention provide an early feedback in the full chip clock tree structure for the chip designer to make the proper change at an early stage. This is achieved by accurate clock tree planning of the integrated circuit.

A system, as described in the present invention or any of its components, may be embodied in the form of a computer system. Typical examples of a computer system include a general-purpose computer, a programmed microprocessor, a micro-controller, a peripheral integrated circuit element, and other devices or arrangements of devices that are capable of implementing the acts of the present invention, including a computer readable medium having computer readable program code embodied therein, as is well understood in the art.

While the preferred embodiments of the present invention have been illustrated and described, it will be clear that the present invention is not limited to these embodiments only. Numerous modifications, changes, variations, substitutions and equivalents will be apparent to those skilled in the art, without departing from the spirit and scope of the present invention, as described in the claims.

What is claimed is:

1. A method for clock tree synthesis of an integrated circuit, the method comprising the steps of:
   a. performing a top-level clock tree synthesis of the integrated circuit;
   b. estimating one or more block-level clock tree structures, wherein each of the block-level clock tree structures comprises a plurality of grids, wherein an accuracy level for the estimating determines grid size; and
   c. merging the one or more estimated block-level clock tree structures with the top-level clock tree synthesis.

2. The method of claim 1, wherein estimating one or more block-level clock tree structures comprises performing a clock tree estimation for each of the plurality of grids.

3. The method of claim 1, wherein each of the plurality of grids comprises a plurality of virtual leaf points, wherein each of the plurality of virtual leaf points comprises one or more real leaf points.

4. The method of claim 3, further comprising determining at least one of clock tree latency and skew for each of the plurality of virtual leaf points, the determination being based on one or more pre-determined parameters.

5. The method of claim 4, wherein the pre-determined parameters comprises at least one of a number of real leaf cells, grid area, and technology specific information.

6. The method of claim 1, wherein performing the top-level clock tree synthesis comprises the steps of:
   a. identifying clock entry points for each partition of the integrated circuit; and
   b. performing a top-level clock tree synthesis up to the identified clock entry points.

7. The method of claim 1 for clock tree synthesis of an integrated circuit being performed by a data processor according to computer-executable instructions stored on a computer-readable medium.

8. A method for clock tree planning of an integrated circuit, the method comprising the steps of:
   a. identifying clock entry points for each partition of the integrated circuit;
   b. performing a top-level clock tree synthesis up to the identified clock entry points;
   c. estimating one or more block-level clock tree structures, wherein the step of estimating comprises:
      i. splitting each block-level clock tree structure into a plurality of grids, each grid comprising a plurality of virtual leaf points, wherein an accuracy level for the estimating determines grid size;
      ii. determining at least one of clock tree latency and skew for each of the plurality of virtual leaf points, the determination being based on one or more pre-defined parameters; and
   d. merging the one or more estimated clock tree structures with the top-level clock tree synthesis.

9. The method of claim 8, wherein performing the top-level clock tree synthesis comprises performing a minimum latency tree synthesis algorithm.

10. The method of claim 8, wherein each of the plurality of virtual leaf points comprises one or more real leaf points.

11. The method of claim 8, further comprising choosing the clock entry points of each partition as the closest point to a clock source.

12. The method of claim 8, wherein the pre-determined parameters comprise at least one of a number of real leaf cells, grid area, and technology specific information.

13. The method of claim 8 for clock tree planning of an integrated circuit being performed by a data processor according to computer-executable instructions stored on a computer-readable medium.

14. A system for clock tree synthesis of an integrated circuit, the system comprising:
   a. means for performing a top-level clock tree synthesis of the integrated circuit;
   b. means for estimating one or more block-level clock tree structures, wherein each block-level clock tree structure comprises a plurality of grids, wherein an accuracy level for the estimating determines grid size; and
   c. means for merging the estimated block-level clock tree structures with the top-level clock tree synthesis.

15. The system of claim 14, wherein the means for estimating one or more block-level clock tree structures comprises means for performing a clock tree estimation for each of the plurality of grids.

16. The system of claim 14, wherein each of the plurality of grids comprises a plurality of virtual leaf points, wherein each of the plurality of virtual leaf points comprises one or more real leaf points.

17. The system of claim 14, wherein the means for estimating one or more block-level clock tree structures comprises means for determining at least one of clock tree latency and skew for each of the plurality virtual leaf points, the determination being based on one or more pre-determined parameters.

18. The system of claim 17, wherein the pre-determined parameters comprises at least one of a number of real leaf cells, grid area, and technology specific information.

19. The system of claim 14, wherein the means for performing the top-level clock tree synthesis comprises:
   a. means for identifying clock entry points for each partition of the integrated circuit; and
   b. means for performing a top-level clock tree synthesis up to the identified clock entry points.

* * * * *